(12) United States Patent
Gale

(10) Patent No.: US 7,830,154 B2
(45) Date of Patent: *Nov. 9, 2010

(54) CONTINUITY TESTER ADAPTORS

(76) Inventor: Robert D. Gale, 4811 Chippendale La., Suite 703, Sacramento, CA (US) 95841

( * ) Notice: Subject to any disclaimer, the term of this patent is extended or adjusted under 35 U.S.C. 154(b) by 0 days.

This patent is subject to a terminal disclaimer.

(21) Appl. No.: 12/047,320

(22) Filed: Mar. 12, 2008

(65) Prior Publication Data
US 2008/0150546 A1 Jun. 26, 2008

(51) Int. Cl.
G01R 31/04 (2006.01)
H01R 13/56 (2006.01)
H01R 27/02 (2006.01)

(52) U.S. Cl. .................. 324/538; 439/445; 439/638
(58) Field of Classification Search .................. 324/538; 439/445, 676
See application file for complete search history.

(56) References Cited

U.S. PATENT DOCUMENTS

| 3,091,743 | A | 5/1963 | Wilkinson |
|---|---|---|---|
| 3,440,329 | A | 4/1969 | Winston |
| 3,468,135 | A | 9/1969 | Doll et al. |
| 3,641,464 | A | 2/1972 | Crowhurst et al. |
| 3,673,517 | A | 6/1972 | Ticknor |
| D236,481 | S | 8/1975 | Johnston |
| 3,951,490 | A | 4/1976 | Devendorf |
| 4,015,070 | A | 3/1977 | Theurer |
| 4,141,615 | A | 2/1979 | Takeuchi et al. |
| 4,226,495 | A | 10/1980 | Palle et al. |
| D261,503 | S | 10/1981 | Shu |
| D264,710 | S | 6/1982 | Shu |
| D274,717 | S | 7/1984 | Shu |
| 4,626,633 | A | 12/1986 | Ruehl et al. |
| 4,648,682 | A | 3/1987 | Tubbs |
| 4,740,172 | A | 4/1988 | Tubbs |
| 4,755,776 | A | 7/1988 | Preschutti |
| D301,239 | S | 5/1989 | Chino |
| 4,875,024 | A | 10/1989 | Roberts |
| D306,716 | S | 3/1990 | Shimirak |
| 5,021,755 | A | 6/1991 | Gustafson |
| 5,058,198 | A | 10/1991 | Rocci et al. |
| 5,059,141 | A | 10/1991 | Scott |
| 5,164,689 | A | 11/1992 | Plonka |
| D346,789 | S | 5/1994 | Sanchez et al. |
| 5,347,245 | A | 9/1994 | Wright, Jr. |
| 5,411,405 | A | 5/1995 | McDaniels et al. |
| 5,416,453 | A | 5/1995 | Quan |
| D366,456 | S | 1/1996 | Rodriguez et al. |

(Continued)

OTHER PUBLICATIONS

Hometech Solutions: RF (VHF/UHF/FM/CATV/Salelite) Splitters; A Splitter Primer; Internet; Mar. 8, 2005; 7 pgs: USA.

*Primary Examiner*—Jeff Natalini
(74) *Attorney, Agent, or Firm*—Glen L Gross; Shlesinger, Arkwright & Garvey, LLP

(57) ABSTRACT

An electrical continuity tester adaptor for attaching to a conventional continuity tester comprising first, second and third members. The first member is operably configured to engage a female F-type connector. The second member is operably configured to engage a female RJ series type connector. The third member includes a plurality of electrical connections and a printed circuit board to facilitate the electrical connectivity between the first and second members.

14 Claims, 5 Drawing Sheets

U.S. PATENT DOCUMENTS

| | | | |
|---|---|---|---|
| 5,572,143 A | 11/1996 | Myers et al. | |
| 5,666,408 A | 9/1997 | Lao | |
| 5,677,578 A | 10/1997 | Tang | |
| 5,687,213 A | 11/1997 | Larkin | |
| D389,112 S | 1/1998 | Foye | |
| D389,801 S | 1/1998 | Foye | |
| 5,735,711 A | 4/1998 | Fremgen | |
| D396,695 S | 8/1998 | Shen | |
| 5,790,411 A | 8/1998 | Nelson | |
| 5,796,316 A | 8/1998 | Romerein | |
| D397,695 S | 9/1998 | Wittmeier, II et al. | |
| D399,846 S | 10/1998 | Beggs | |
| D404,713 S | 1/1999 | Hsiang | |
| D408,363 S | 4/1999 | Hsiang | |
| D408,364 S | 4/1999 | Hsiang | |
| 5,903,829 A | 5/1999 | Anderson et al. | |
| D410,629 S | 6/1999 | Bandura et al. | |
| D410,895 S | 6/1999 | Bandura et al. | |
| 5,909,155 A | 6/1999 | Anderson et al. | |
| 5,973,262 A | 10/1999 | Matuara | |
| 5,975,300 A | 11/1999 | Gale | |
| 5,997,358 A * | 12/1999 | Adriaenssens et al. | 439/676 |
| D421,965 S | 3/2000 | Johnston et al. | |
| 6,118,354 A | 9/2000 | Decramer et al. | |
| D459,304 S | 6/2002 | Malin | |
| D459,305 S | 6/2002 | Malin | |
| D459,306 S | 6/2002 | Malin | |
| 6,289,210 B1 | 8/2002 | Anderson et al. | |
| 6,437,580 B1 | 8/2002 | Gale | |
| 6,482,019 B1 | 11/2002 | Lo Forte et al. | |
| D475,019 S | 5/2003 | Soulodre | |
| D475,020 S | 5/2003 | Soulodre | |
| 6,750,465 B2 | 5/2003 | Tang | |
| D475,350 S | 6/2003 | Soulodre | |
| 6,599,152 B1 | 7/2003 | Oliphant et al. | |
| 6,653,846 B2 | 11/2003 | James | |
| 6,731,217 B1 | 5/2004 | Warner | |
| D492,292 S | 6/2004 | Ogren | |
| 6,786,757 B2 | 9/2004 | Pocrass | |
| 6,790,049 B2 | 9/2004 | Kaylie et al. | |
| 6,844,793 B2 | 1/2005 | Kenington | |
| 6,956,449 B2 | 10/2005 | Snyder et al. | |
| 6,960,917 B2 | 11/2005 | Parker et al. | |
| 7,030,624 B1 | 4/2006 | Love | |
| 7,126,437 B2 | 10/2006 | Simon et al. | |
| 7,160,151 B1 * | 1/2007 | Rigby et al. | 439/607 |

* cited by examiner

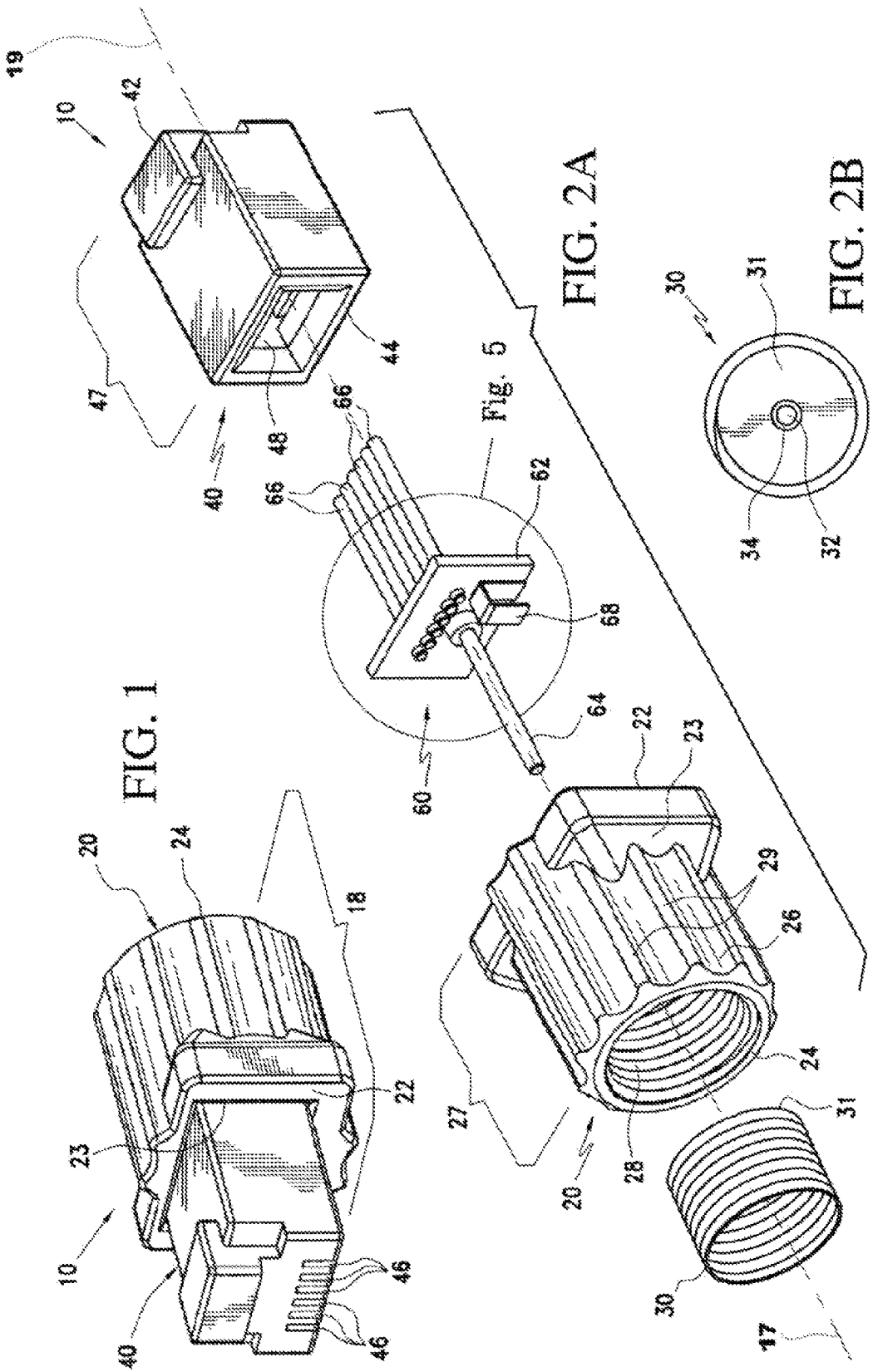

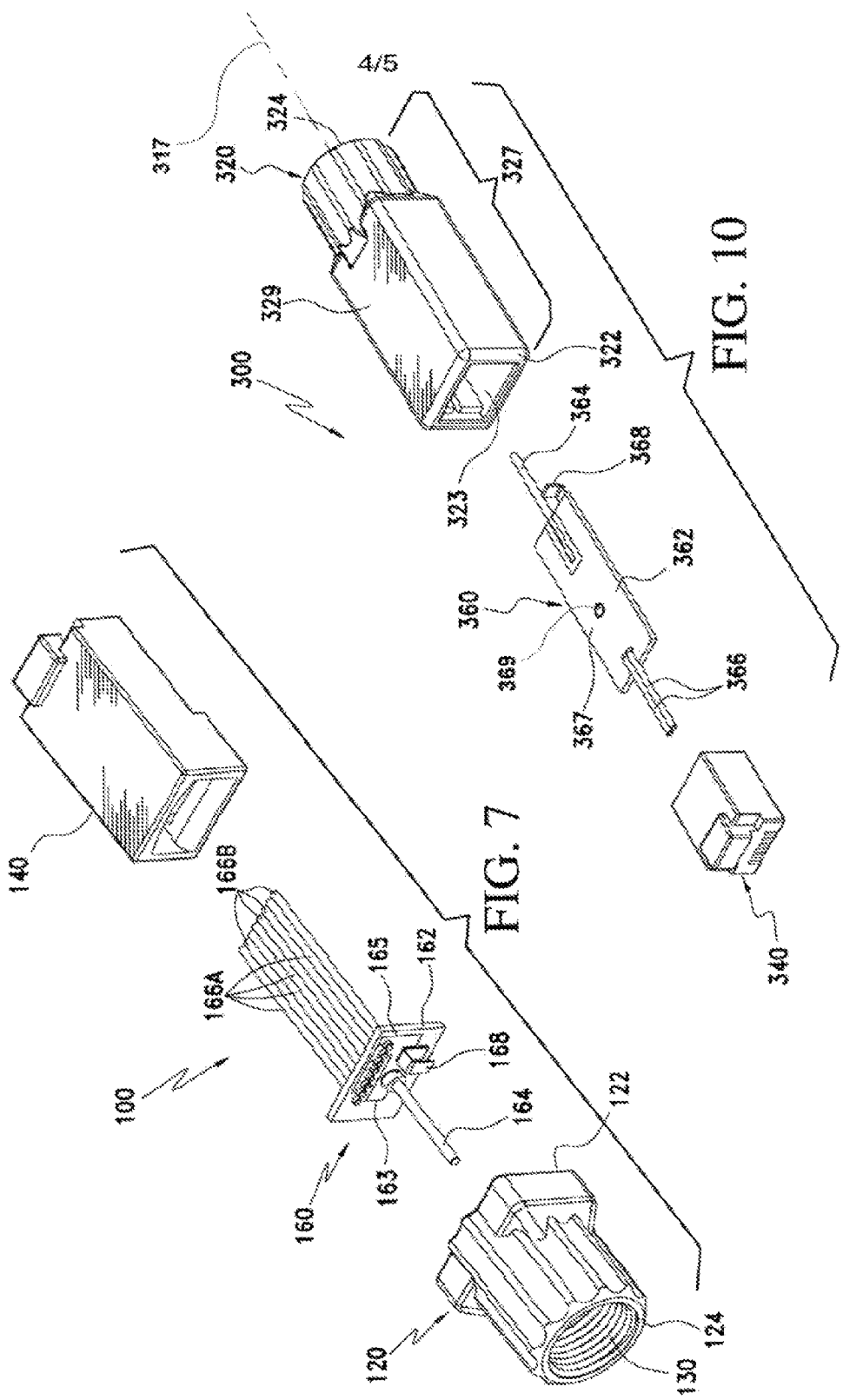

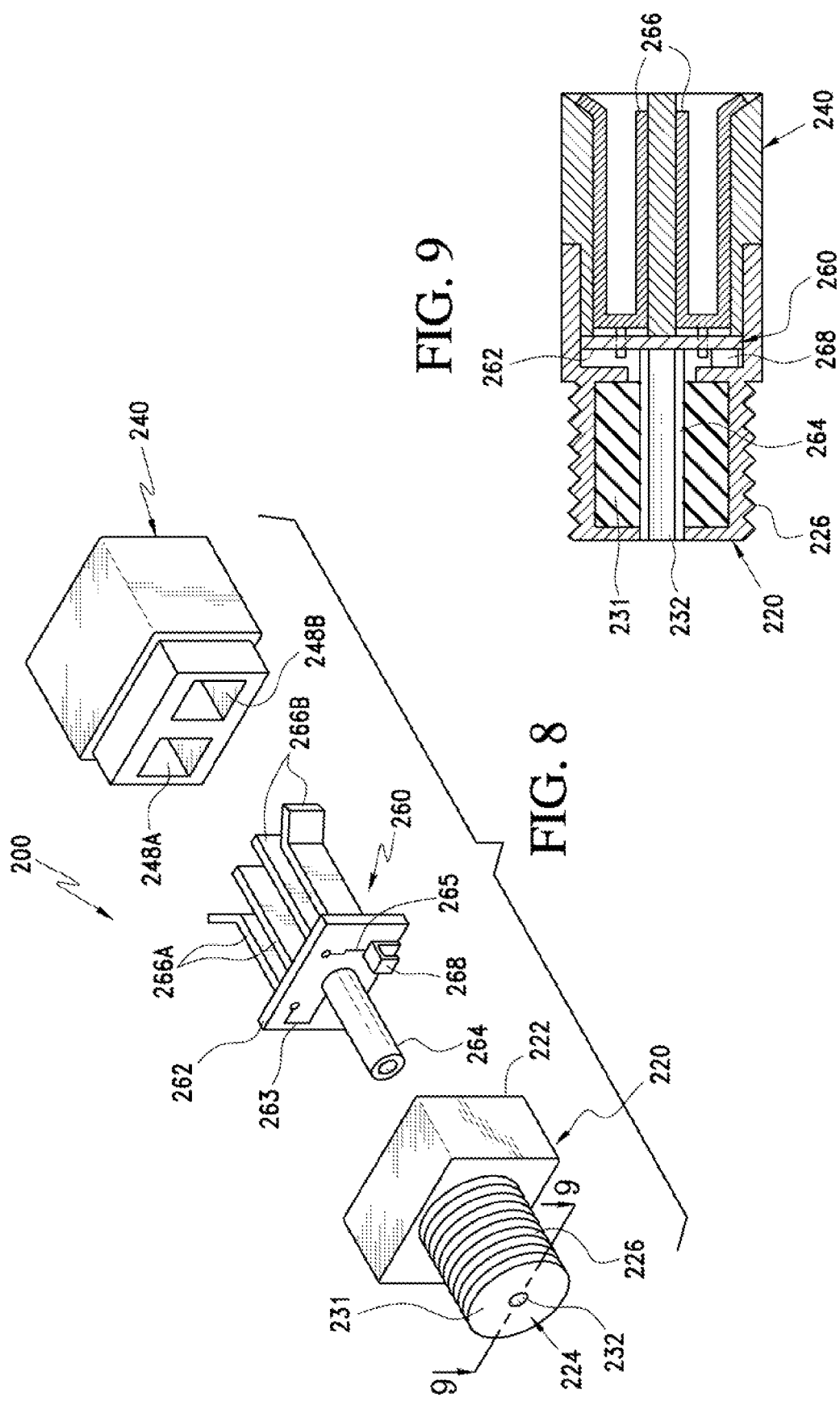

CONTINUITY TESTER ADAPTORS

CROSS REFERENCE TO RELATED APPLICATION

This nonprovisional application claims the benefit of Provisional Application No. 60/691,150, filed on Jun. 15, 2005, and Nonprovisional application Ser. No. 11/424,521, filed on Jun. 15, 2006, which are incorporated herein by reference in their entirety and to which priority is claimed.

BACKGROUND OF THE INVENTION

1. Field of Invention

The present invention relates generally to electrical circuit tester adapters for testing and tracing electrical circuit; and, it relates more specifically to adapters for testing the continuity of telephone and local area network (LAN) cables.

2. Description of Related Art

Wire connectivity is essential to the proper function of telephone systems; cable television (CATV) systems; security systems; closed-circuit television (CCTV) systems; local and wide area computer networks (LANs and WANs); and, other multi-node, and multi-user systems. When a wire fault is encountered, the tracing of individual cables through wire bundles, and confirming their electrical continuity, often can be tedious and cause significant problems. Cables or wire are often not identified with corresponding tags, labels or color-coding at both ends, so technicians installing or testing pre-wired systems, or removing, repairing or re-routing the cables of an existing system, have to sort through and test each cable individually. This commonly entails sorting through a number of upstream wire ends at a junction box or panel, and testing each against individual downstream terminals where they connect to devices.

In the tracing of wires, in particular telephone and LAN type wires from its downstream terminus back to the junction box, a technician normally secures a short circuit or low-resistance wire terminator to the downstream terminus of the desired cable and then, back at the junction box, connects a volt-ohm meter (VOM) to each upstream wire end, one-by-one. All wires but the correct one will produce a substantially infinite resistance reading, while the desired cable will show continuity. If a standard 75-ohm terminator is used at the downstream terminal, a 75-ohm resistance reading on the meter confirms that no mid-wire short is present. Proceeding one-by-one through a great number of wire ends is a very tedious, laborious process. And, it is even more difficult and time-consuming if the technician desires to determine which of a multitude of downstream wire ends are associated with a particular upstream wire end at the junction box. In that case, the technician must either affix a terminator to the upstream end and walk room-to-room or workstation-to-workstation connecting a VOM to each downstream terminal, searching for continuity. Or, the technician must connect the VOM to the upstream end of the desired wire at the junction box and, repeatedly, walk to a downstream terminal; connect a terminator; and, walk back to the junction box to read the meter.

To aid technicians in trouble-shooting electrical wires and cables, various conventional devices have been used and proposed for more convenient testing and tracing of wire systems. Miniaturized, limited-purpose versions of VOMs having cables, probes, clips, adaptors, LED's, tone generators and streamlined cases are commonly available, but they are generally difficult to use among tangled masses of cable ends, and must be carried in a toolbox rather than in the technician's pocket. Accordingly, there is a need for an easily manipulable, easy to read device for testing and tracing of wire bundles. One such conventional device to perform the above mentioned type testing for coaxial cables is the Gale Cable continuity tester and tracer (Pocket Toner) of U.S. Pat. No. 6,437,580, which is incorporated herein by reference in its entirety.

Conventional continuity testers like the Gale Pocket Toner are very versatile for testing coaxial cables, such conventional testers lack the ability to test the continuity of each line in telephone wire or LAN cable. With the complexity of modern office buildings where each office will have electrical outlets, coaxial cable, telephone and LAN connections, an electrician must carry many different style testing devices to test each type of circuit.

Further, conventional continuity tester do not have the ability to detect telephone on and off hook conditions. Technicians need to carry with them a larger and more expensive dial tone testing device.

Accordingly, it appears there exists a need to adapt an easily manipulable, easy to read pocket continuity testing device for the testing and tracing continuity in multiple type of electrical circuits.

SUMMARY OF INVENTION

It is the object of the present invention to overcome the drawbacks and shortcomings of conventional pocket wire testing devices. This present invention allows for the placing of adaptors on existing continuity testers to allow the inspection of wire systems, such as telephone lines and LAN cables in addition to coaxial cables.

A technician can now carry a conventional pocket continuity tester and with the addition of the present invention expand the applicability of the conventional pocket continuity tester to test other wires or cables such as telephone lines.

Further, the present invention reduces the risk of electrical shock to the technician. The device made according to the present invention uses a non-conductive material, therefore, when the device is in use no metal parts are contacting a live electrical wire.

The present invention also provides the ability to detect a telephone on/off hook condition without the need for an additional testing device.

The present invention discloses a continuity tester adaptor, which comprises a first member having a first end, a second end with a hollow body and an electrical ground. The second end of the first member is operably configured to engage a first type of electrical receptacle. The continuity tester adaptor further comprises a second member having a first end with a plurality of channels and a second end with a chamber and the plurality of channels extend to the chamber, wherein the first end of the second member is operably configured to engage a second type of electrical receptacle. The second end of the second member is disposed adjacent to the first end of the first member. Additionally, the continuity tester adaptor includes a third member comprising a first connector, a second connector, a plurality of electrical contacts, and a printed circuit board (PCB) having a first and second surface. The first and second connectors of the PCB are attached to the first surface of the PCB. The PCB is disposed between the first member and second member such that the first connector is disposed in the hollow body of the second end of the first member and the second connector is engaged with the electrical ground of the first member. The plurality of electrical contacts are fixedly attached to the second surface of the PCB and one half of the plurality of electrical contacts are in electrical communication with the first connector, and the remaining half of the plurality of electrical contacts are in electrical communication with the second connector. The plurality of electrical contacts are disposed in the plurality of channels of the second member.

The present invention further provides a printed circuit board for an electrical continuity tester adaptor comprising a first surface and second surface and a first connector disposed on the first surface and operably configured to engage a positive contact on a first type of electrical receptacle. The printed circuit board also includes a second connector disposed on the first surface and operably configured to engage a ground contact on the first type of electrical receptacle and a plurality of contacts having an equal number of positive and negative contacts being disposed on the second surface and operably configured to engage a second type of electrical receptacle. Additionally, the printed circuit board further comprises a first conducting path operably configured to complete an electrical connectivity between the first connector and the plurality of positive contacts; and, a second conducting path operably configured to complete an electrical connectivity between the second connector and the plurality of negative contacts.

Further, the present invention is an electrical continuity tester adaptor that comprises a first member having a first end with a cavity, a second end with a hollow body, and a ground sheath disposed in the hollow body, wherein the second end is operably configured to engage an F-type connector and the first member is a non-conductive material. The electrical continuity tester adaptor of the present invention also includes a second member having a first end with a plurality of channels and a second end with a chamber and the plurality of channels extend to the chamber. The first end of the second member is operably configured to engage a RJ series connector, wherein the second end of the second member is disposed in the cavity of the first member, and wherein the second member is a non-conductive material. The electrical continuity tester adaptor further comprises a printed circuit board disposed in the cavity and having: a first and second surface; a F-type male connector disposed on the first surface operably configured to engage the female F-type connector through the hollow body of the second end of the first member; a ground contact disposed on the first surface and operably configured to engage the ground sheath on the first member; a plurality of contacts having an equal number of positive and negative contacts being disposed on the second surface. The plurality of contacts are operably configured to engage the plurality of channels through the orifice of the second end of the second member; a first conducting path operably configured to complete an electrical connectivity between the F-type male connector and the plurality of positive contacts; and, a second conducting path operably configured to complete an electrical connectivity between the ground contact and the plurality of negative contacts.

The present invention additionally provides a method of assembling in a continuity tester adaptor for a RJ series connector, comprising the steps of acquiring a first type of electrical connector having a first end and a second end, wherein the first end has a plurality of channels and is operably configured to engage a RJ series female connector and the second end is operably configured to receive a plurality of electrical contacts; acquiring a printed circuit board, wherein the printed circuit board has a first surface and a second surface, and disposed on the second surface are the plurality of electrical contacts having equal number of positive and negative contacts and operably configured to correspond to the first type of electrical connector, and disposed on the first surface is a pin and a ground contact operably configured to electrically connect the positive contacts to the pin and the negative contacts to the ground contact, and to correspond to a male F-type connector. The method of the present invention further includes the steps of assembling the printed circuit board to the first type of electrical connector so that the plurality of electrical contacts on the printed circuit board are disposed in the plurality of channels in the first end of the first type of electrical connector; acquiring a hollow non-conductive cylindrical housing having a first end and a second end, wherein the first end is operably configured to receive the assembled printed circuit board and first type of electrical connector, and the second end has a hollow conductive insert; and, assembling the hollow cylindrical housing to the assembled printed circuit board and first type of electrical connector so that the ground contact engages the conductive insert and the pin becomes a center post on the male F-type connector.

This invention overcomes the drawbacks and shortcomings of the prior art conventional devices and systems. These and other features and advantages of this invention are described in, or are apparent from, the following detailed description of various exemplary embodiments of the devices and methods according to this invention.

BRIEF DESCRIPTION OF THE DRAWINGS

Various exemplary embodiment of this invention will be described in detail, with reference to the following figures, wherein;

FIG. 1 is a perspective view of a device made in accordance with the present invention;

FIG. 2A is an exploded perspective rear view of the device in FIG. 1;

FIG. 2B is a rear view of an insert of the device in FIG. 2A;

FIG. 7 is an exploded perspective view of an alternative embodiment of the device made in accordance with the present invention;

FIG. 8 is an exploded perspective view of a further alternative embodiment of the device made in accordance with the present invention;

FIG. 9 is a cross-sectional view along line 9-9 in FIG. 8; and,

FIG. 10 is a perspective view of an additional alternative embodiment of the device made in accordance with the present invention.

DETAILED DESCRIPTION

Figure 4:
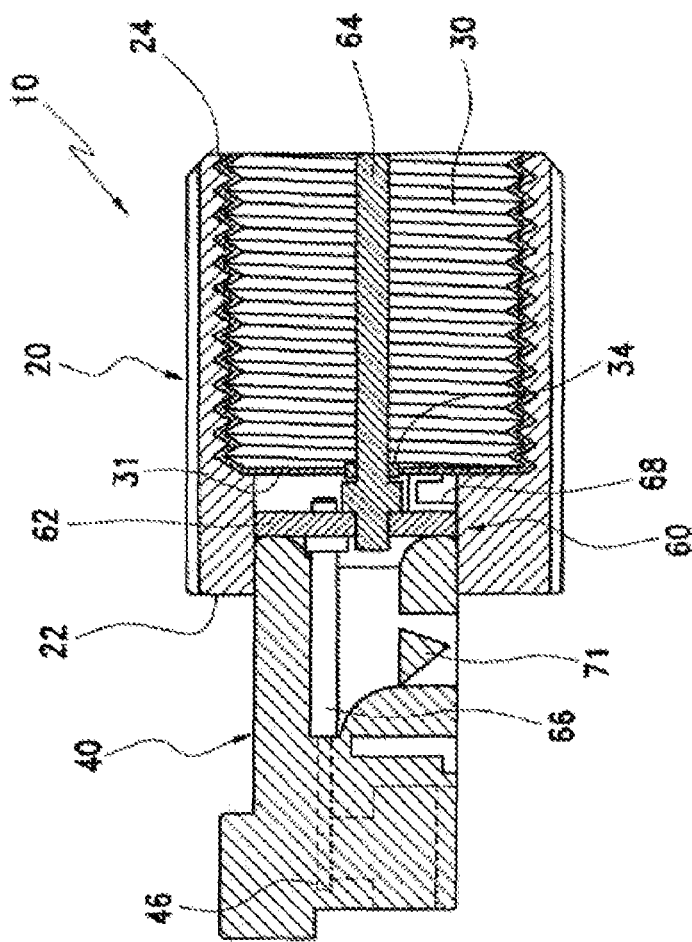
FIG. 4 is a cross-sectional view along line 4-4 in FIG. 3 of the device made in accordance with the present invention.

FIG. 1 is a perspective view of a device or test adapter 10, made in accordance with the invention. The device 10 is a continuity test adapter for testing the continuity in a telephone line comprising a first member 20, a second member 40 and a third member 60, as shown in FIG. 2A. The first member 20 is operably configured to engage a coaxial cable female connector. The second member 40 is operably configured to engage an electrical female connector receptacle. The device 10, in the present embodiment, the first member 20 is operably configured to engage a testing device, such as the Gale Pocket Toner, U.S. Pat. No. 6,437,580, and the second member 40 is operably configured to engage an electrical female connector receptacle. In the present embodiment the electrical connector receptacle is a standard female telephone RJ-11 jack (not shown). The second member 40 engages the female RJ-11 jack to permit a user to test a telephone line in the RJ-11 jack for continuity.

As shown in FIGS. 1 through 4, the first member 20 is an elongated hollow cylindrical body and includes a first end 22 having a cavity 23 and a second end 24. The first member 20 further includes an external surface 26, and an internal surface 28, wherein the first member 20 has openings at both the first end 22 and the second end 24. The second end 24 of the first member 20 in the present embodiment is an F-type male connector. The second end 24 of the first member 20 is operably configured to engage a standard coaxial F-type female connector. It should be appreciated that in other various exemplary embodiments, the second end could be operably configured to engage other types of connectors common in the art of coaxial connectors.

The cavity 23 of the first member 20 has a generally rectangular shape and is operably configured to receive the second member 40. It should be appreciated that in other various exemplary embodiments, the cavity could be other shapes such as, but not limited to, circular or oval. In the present embodiment, the cavity 23 has a generally rectangular opening, as shown in FIG. 1, and is operably configured to receive the third member 60 and engage the second member 40.

The first member 20 is constructed out of a non-conducting material, a protective feature to reduce the risk of electrical shock to a technician. In the present embodiment, the first member 20 is constructed out of molded plastic. However, it should be appreciated that in other various exemplary embodiments, the first member could be constructed out of other non-conductive materials or conductive materials coated with a non-conductive material common in the art.

The first member 20 further includes a length 27. The length 27 in the present embodiment is designed to be 14.55 mm (0.57 inches). The length 27 is kept to a minimum to keep the overall length of the device 10 to a minimum in order to permit the device 10 to be used in a tight space. However, it should be appreciated that in other various exemplary embodiments the length of the first member could of other dimensions.

The first member 20 also includes a longitudinal axis 17 and an insert 30, as shown in FIG. 2A. The insert 30 includes a first surface 31, wherein the first surface 31 includes an orifice 32 and a non-conductive bushing 34, as shown in FIG. 2B. The insert 30 is a treaded conductive insert. The insert 30 acts as an electrical ground for the F-typed male connector.

Still referring to FIG. 2A, the internal surface 28 of the second member 20 in the present embodiment is treaded and operably configured to engage the insert 30. In the present embodiment, the insert 30 is treaded into the internal surface 28 of the first member 20. It should be appreciated that in other various exemplary embodiments, the insert could be secured to the internal surface by other methods common in the art such as, but not limited to, gluing or crimping. Further, it should be appreciated that in other various exemplary embodiments, the insert could of other designs to correspond with other type connectors common in the art.

The external surface 26 in the present embodiment has a plurality of ridges 29. The ridges 29 enable the user to better grip the device 10. It should be appreciated that in other various exemplary embodiments, the external surface could be of other designs common in the art.

Referring to FIGS. 1 though 4, the second member 40 comprises a generally rectangular shaped body having an internal volume. The second member 40 has a first end 42 and a second end 44. The second member 40 is constructed out non-conductive material. The present embodiment is molded plastic. However, it should be appreciated that in other various exemplary embodiments the second member could be constructed out of other non-conductive materials common in the art of electrical connectors could be used. The use of non-conductive material is a protective feature to reduce the risk of electrical shock to the technician. Further the second member 40 in the present invention is transparent.

Figures 5, 6:
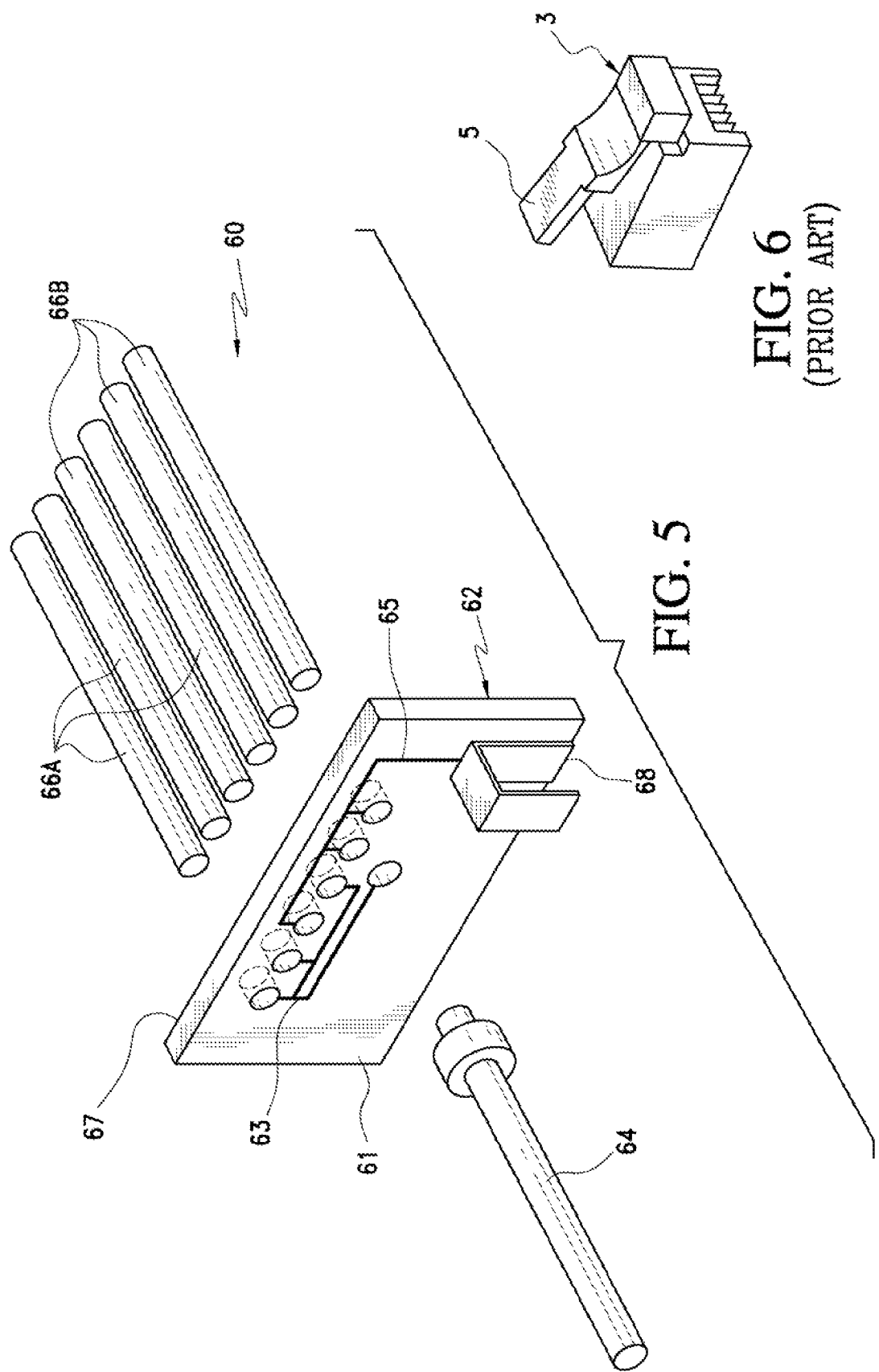
FIG. 5 is a detail perspective view of circle 5 in FIG. 2A of a printed circuit board made in accordance with the present invention in the device of FIG. 1.
FIG. 6 is a perspective view of a conventional RJ-11 male connector, which is prior art.

FIG. 6 is an embodiment of a conventional RJ-11 male plug 3. The conventional RJ-11 male plug 3 includes a locking lever or locking mechanism 5. The second member 40, in the present embodiment is a RJ-11 male plug similar to the conventional RJ-11 male plug 3 shown in FIG. 6. The first end 42 of the second member 40 is operably configured to engage a standard RJ-11 female receptacle. A difference between the second member 40 of the device 10 and a conventional RJ-11 plug 3 in FIG. 6 is that the second member 40 of the device 10 does not include a locking lever 5 that is shown in FIG. 6. The lack of the locking lever 5 is an advantage over conventional adaptors, in that the device 10 can quickly be placed in a matching receptacle and quickly removed without the need to compress the locking lever 5 by the user. It should be appreciated that in other various exemplary embodiments, the second member could be of other connector designs of electrical connectors such as, but not limited to, RJ-45, Bayonet Neill Concelman (BNC), audio/video, Universal Serial Port (USB) or other types of connectors common in the field of electrical connectors.

Referring now to FIG. 4, the second member 40 further includes other features common to the conventional RJ-11 plug shown in FIG. 6, in that the second member 40 also includes a crimping tab 71. It should be appreciated that the second member could be manufactured without the crimping tab.

Figure 3:
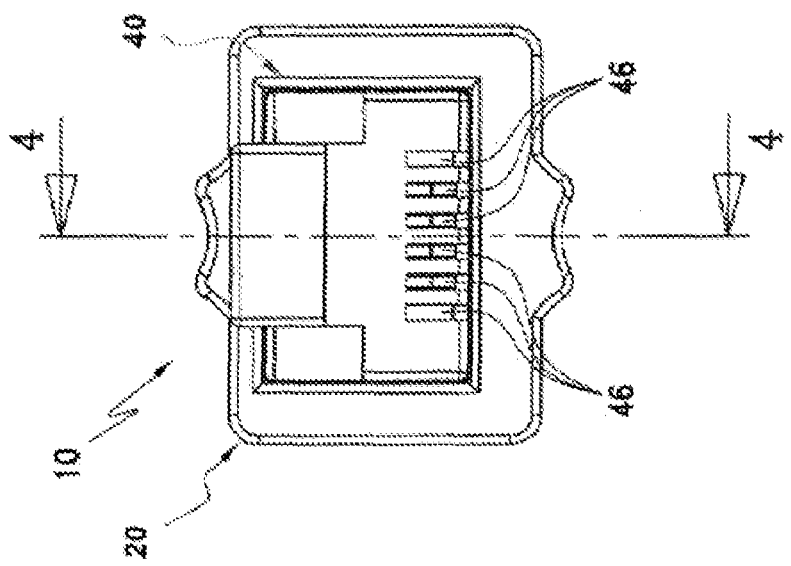
FIG. 3 is a front view of the device of FIG. 1.

The first end 42 of the second member 40 further includes a plurality of contact channels 46, as shown in FIG. 3. In the present embodiment, the second member 40 has six contact channels 46 to conform to the standard RJ-11 male plug. It should be appreciated that in other various exemplary embodiments the number of channels will vary depending on the type of RJ series plug used.

The second end 44 of the second member 40 has a generally rectangular shape, as shown in FIG. 2A. The second end 44 is operably configured to engage the cavity 23 of the first member 20. It should be appreciated that in other various exemplary embodiments, the second end of the second member could be of other shapes such as, but not limited to circular or oval for example.

Further, the second member 40 includes a longitudinal axis 19, a length 47 and a chamber 48. The length 47 in the present embodiment is 13.28 mm (0.52 inches). The plurality of channels 46 extend through the length 47, parallel and offset to the axis 19 to the chamber 48.

The third member 60, as shown in FIGS. 2 and 5, includes a printed circuit (PC) board 62, a first connector or pin 64, a second connector or ground connector 68, and a plurality of electrical contacts 66. The PCB 62 has a generally rectangular shape and is operably configured to be disposed in the cavity 23 substantially perpendicular to the longitudinal axis 17 of the first member 20, as shown in FIGS. 2 and 4.

The PC board 62 also includes a first and second surface 61 and 67, a first conducting path 63 and a second conducting path 65. The pin 64 and the ground contact 68 are both disposed on the first surface 61. The plurality of contacts 66 are disposed on the second surface 67. Further, the first and second conducting paths 63 and 65 are both disposed in the PCB 62.

The plurality of electrical contacts 66 of the third member 60 are disposed on the second surface 67 of the PCB 62 and are operably configured to engage the contact channels 46 in the second member 40. The plurality of contacts 66 are constructed out of an electrically conductive material. The contacts 66 in the present invention are made out of brass, however it should be appreciated that in other various exemplary embodiments the contacts could be constructed out of other electrically conductive material common in the art, such as, but not limited to, gold or aluminum. Further, the plurality of contacts 66 in the present embodiment are soldered to the PCB 62. It should be appreciated that in other various exemplary embodiments the plurality of contacts could be attached to the PCB with the use of other methods common in the art of making PCBs.

Further, the plurality of electrical contacts 66 are divided into two groups, a plurality of positive contacts 66A and a plurality of negative contacts 66B, as indicated in FIG. 5. The first conducting path 63 connects the plurality of positive contacts or "tips" 66A and completes the circuit to the pin 64. The second conducting path 65 connects the plurality of negative contacts or "rings" 66B and completes the circuit to the ground connector 68. It should be appreciated that in other various exemplary embodiments, the first and second conducting paths may be arranged so that they complete the circuits required depending on the choice of the second member used, for example an RJ-45 plug.

FIG. 2B is a rear view of the insert 30 showing the orifice 32 and the non-conductive bushing 34. The pin 64 is disposed on the PCB 62 such that the pin 64 is positioned in the orifice 32 of the insert 30 and along the longitudinal axis 19 of the first member 20. The nonconductive bushing 34 insulates the pin 64 from the insert 30.

The pin 64 is constructed out of an electrically conductive material. In the present embodiment the pin 64 is brass, however, it should be appreciated that in other various exemplary embodiments, the pin could be made from other conductive materials common in the art. Further, the pin 64 in the present embodiment is soldered to the PC board 62. It should be appreciated that in other various exemplary embodiments the pin could be attached to the PC board with the use of other methods common in the art of making printed circuit boards.

The PCB 62 is operably configured to provide an electrical interface between the RJ series plug and the F-type connector. For example, the device 10 in the present embodiment is set up for the standard RJ-11 plug, which can have up to six contacts. In the standard RJ-11 plug, the six contacts equates to three pairs of lines.

The path 63 connects the positive contacts 66A to the pin 64 and the path 65 connects the negative contacts 66B to the ground contact 68, as shown in FIG. 5. Thus the PCB 62 completes the electrical connectivity from the second member or male RJ-11 plug 40 into the first member or male F-type connector 20. Now, when using the testing device, such as the Gale Pocket Toner, the technician can test the continuity of a telephone line.

It should be appreciated the in other various exemplary embodiments, the third member can be arrange to meet the second member type plug used. For example, in the United States the Universal Service Order Code (USOC) standard is used. Another industry standard is the Telecommunications Industry Association/Electronics Industry Association (TIA/EIA), which has two different configurations, the TIA/EIA-568A and the TIA/EIA-568B. The printed circuit board can be arranged to match the appropriate configuration of either the USOC, the TIA/EIA or other standards as required.

Referring again to FIG. 2A, the device 10 is assembled by the plurality of contacts 66 of the third member 60 being inserted into the chamber 48 of the second member 40 such that the plurality of contacts 66 insert into the plurality of channels 46. The plurality of contacts 66 are substantially parallel and offset of the axis 19 of the second member 40. The second member 40 and the third member 60 are then disposed into the cavity 23 of the first member 20, as shown in FIGS. 2 and 4, such that the third member 60 is between the first member 20 and second member 40. The third member 60 is disposed in the cavity 23 such that the first and second surfaces 61 and 67 of the third member 60 are substantially perpendicular to the axes 17 and 19 of the first and second members 20 and 40. In the present embodiment the second member 40 is glued to the first member 20. However, it should be appreciated that in other various exemplary embodiments, the second member can be attached to the first member by other methods such as, for example, crimping or other method common in the art. Further, it should be appreciated the in other various exemplary embodiments, the device could be attached so that the device is waterproof.

As the third member 60 is disposed in the cavity 23 of the first member 20, the ground contact 68, which has bias towards the first member 20, contacts the insert 30 to complete the electrical connection for the negative contacts 66B. Further, the pin 64 is along the axis 17 of the first member 20 when the third member 60 is disposed in the cavity 23. It should be appreciated that in other various exemplary embodiment, it is contemplated that the ground contact could be of other designs such that the ground still engages the insert completing the circuit between the negative contacts and the insert.

The device 10 further has a length 18, as shown in FIG. 1, in that the length 18 is formed by the combination of the first and second members, 20 and 40. The length 18 in the present embodiment is 25.93 mm 91.02 inches).

Additionally, in the present invention the PCB 62 improves the manufacturing process the device 10. The device 10 can be manufactured quicker because the three members 20, 40, and 60 are assembled together with not requirement to strip, separate and twist wires as in conventional devices. Further, the use of the PCB 62 improves the quality of the device 10 over conventional devices for a variety of connector types.

Further the PCB 62 being disposed substantially perpendicular to the axis 19 of the first member 20 permits the length 18 of the device 10 to be substantially shorter than conventional adaptors. The length 18 gives the device 10 an advantage over conventional adaptors, in that the device 10 can be used with continuity testers in areas more confined than conventional adaptors can be used.

In the present invention, as shown in FIGS. 1 through 5, the second member 40 of the device 10 is configured as male RJ-11 plug to engage a female RJ-11 connector receptacle, however, it should be appreciated that in other various exemplary embodiments, the device could be constructed to include any plug that is compatible with the RJ series industry standard, such as for example a RJ-45 plug, as can be seen in FIG. 7 and will be described below.

Further, while the present embodiment has a male RJ series plug on the second member 40 and a male F-type series plug on the first member 20, it should be appreciated that in other various embodiments any combination of male-male, male-female, female-male, and female-female is anticipated by the present invention.

Still further, as mentioned above the device 10 of the present invention is configured to be used with the conventional pocket continuity tester. For the device 10 it is assumed that the conventional pocket continuity tester has a female F-type connector to connect to the first member 20 of the device 10. It should be appreciated that if the conventional pocket continuity tester has a male F-type connector, then a conventional F-type female-female connector. Additionally, it should be appreciated that in various alternative embodiments, the device may be configured with a female F-type connector so that the device may be used with conventional pocket continuity testers that have a F-type male connector.

FIG. 7 is an exploded perspective view a device 100, wherein device 100 is an alternate embodiment made in accordance with the present invention. The device 100 is similar to the device 10 described above. The device 100 includes a first member 120, a second member 140 and a third member 160. The device 100 also includes an insert 130 and a printed circuit board (PCB) 162 similar to the PCB 62 of the device 10. The first member 120 is the same as the first member 20 of the device 10

One difference in the device 100, for example is that the second member 140 is a conventional RJ-45 male plug without a locking lever and is operably configured to engage a RJ-45 female receptacle.

The third member or PCB 162 is similar to the PCB 62 of the device 10 above. The PCB 162 includes a pin 164, a first and second conductive path 163 and 165 and a ground contact 168, A difference in the PCB 162 is that the third member 160 includes a plurality of contacts 166, wherein this embodiment has eight connectors to conform to the RJ-45 plug of the TIA/EIA 568A standard. The plurality of contacts 166 also has two groups, a plurality of positive contacts 166A and a plurality of negative contacts 166B, as shown in FIG. 7.

FIG. 8 is an exploded perspective view of a device 200, wherein device 200 is a further alternative embodiment made in accordance with the present invention. The device 200 is similar to the device 10 described above. The device 200 includes a first member 220, a second member 240 and a third member 260. The device 200 also includes a printed circuit board (PCB) 262 similar to the PC board 62 of the device 10.

One difference in the device 200 is that the first member 220 instead of being a F-type male connector, the first member 220 is a F-type female connector. The first member 220 includes a first end 222, a second end 224 and an external surface 226, wherein the external surface 226 is a threaded conductive material. Further the second end 224 includes a non-conductive insulator 231 and a cylindrical orifice 232.

Another difference in the device 200 is that the second member 240 is operably configured to engage a standard 66 block telephone junction terminal. Further, the second member 240 includes a plurality of orifices 248A and 248B.

The PCB 262, as shown in FIG. 9, includes pin 264, a plurality of connectors 266 and ground contact 268. The pin 264 is cylindrical and operably configured to be disposed in the cylindrical orifice 232, as shown in FIG. 9. Additionally, the pin 264 has a hollow shaft operably configured to receive a post from an F-type male plug.

The plurality of contacts 266 include a pair of positive contacts 266A and a pair of negative contact 266B. The positive contacts 266A are electrically connected to the pin 264 by a first conductive path 263. The negative contacts 266B are electrically connected to the ground contact 268 by a second conductive path 265, as shown in FIG. 8.

Additionally, the positive contacts 266A engage orifice 248A and the negative contacts 266B engage the orifice 248B.

FIG. 10 is an exploded perspective view of a device 300, wherein device 300 is a further alternative embodiment made in accordance with the present invention. The device 300 is similar to the device 10 described above. The device 300 includes a first member 320, a second member 340 and a third member 360. The device 300 is used to further test a telephone line for an on hook, off hook or no dial tone condition.

The first member 320 is similar to the first member 20 in the device 10. The first member 320 includes a first end 322, a second end 324 and a longitudinal axis 317. Further, the first member 320 includes an electrically conductive insert (not shown), wherein the insert is similar to the insert 30 in device 10, in that the insert includes a first surface, an orifice and a nonconductive bushing (all not shown).

The first member 320 is different in that the first member 320 includes a body 329, wherein the body 329 is has cavity 323 and is a generally rectangular shape. Additionally, the first member has a length 327. The length 327 is longer than the length 27 of the device 10.

The third member of the device 300 also includes a first side 367 and a printed circuit board (PCB) 362 similar to the PCB 62 of the device 10. The PCB 362 also includes a pin 364, a ground tab 368 and a plurality of connectors 366. In this embodiment the third member 340 has only two connectors 266, wherein the second member 340 is configured for a RJ-11 adaptor wired for a telephone only. The PCB 362 engages the first member 320, that the PCB 362 fits in the cavity 321 and the ground contact 368 engages the insert.

A difference in the third member 360 is that third member 360 is disposed in the first member 320 such that the first side 367 is substantially parallel to the longitudinal axis 317 of the first member 320.

Another difference in the PCB 362 of the third member further includes circuitry (not shown) to detect a dial tone in the telephone line, wherein the circuitry on the PC board 362 is common in the art of telephone dial tone detectors. The PCB 362 additionally includes a multi-colored Light Emitting Diode (LED) 369.

The device 300 includes the additional capability to test an on or off hook condition of a telephone line, or a dead line. When the first member 320 of the device 300 is connected to a continuity tester, such as the Gale Pocket Toner in U.S. Pat. No. 6,437,580, and the second member 340 is engaged to a RJ-11 female receptacle connected to a telephone line, the device 300 will light the LED 369 a first color if the line is on-hook and light the LED 369 a second color if the line is off-hook. If the line id dead, the LED 360 will be off. In this embodiment, the first color is green and the second color is red. However, it should be appreciated that in other various exemplary embodiments, other colors may be used.

Further, when the device 300 is used with a continuity tester, such as the Gale Pocket Toner in U.S. Pat. No. 6,437,580, which has the capacity to produce tones, the device 300 will permit the continuity tester to produce a first tone for the on-hook condition and a second tone for the off-hook condition. No tone is produced for the dead line condition. In the present embodiment, the first tone is a steady audible frequency and the second tone is an on-off-on, or broken, audible frequency. It should be appreciated that in other various exemplary embodiments other audible frequency combinations may be used.

The present invention also includes a method of manufacturing the device 10. The method of assembling in a continuity tester adaptor for a RJ series connector, comprising the step of acquiring a first type of electrical connector having a first side and a second side, wherein the first side is operably configured to engage a RJ series female connector and the second side is operably configured to receive a plurality of electrical contacts; acquiring a printed circuit board, wherein the printed circuit board has a first surface and a second surface, and disposed on the first surface is a pin and a ground contact operably configured to electrically connect the positive contacts to the pin and the negative contacts to the ground contact and to correspond to a male F-type connector, and disposed on the second surface are the plurality of electrical contacts having equal number of positive and negative contacts and operably configured to correspond to the RJ series male connector; and, assembling the printed circuit board to the RJ series connector so that the plurality of electrical contacts on the printed circuit board engages on the second side of the RJ series male connector. The method further includes the steps of acquiring a hollow non-conductive cylindrical housing having a first end and a second end, wherein the first end is operably configured to receive and engage the assembled printed circuit board and RJ series connector, and the second end has a hollow conductive insert; and, assembling the hollow cylindrical housing to the assembled printed circuit board and RJ series connector so that the ground contact engages the conductive insert and the pin becomes a center post on the F-type male connector.

While this invention has been described in conjunction with the specific embodiments outlined above, it is evident that many alternatives, modifications and variations will be apparent to those skilled in the art. Accordingly, the preferred embodiments of the invention, as set forth above, are intended to be illustrative, not limiting. Various changes may be made without departing from the spirit and scope of this invention.

What is claimed is:

1. A continuity tester adaptor comprising;
    a first member having a first end, a second end with a hollow body and an electrical ground, wherein the second end of the first member is operably configured to engage a first type of electrical receptacle;
    a second member having a first end with a plurality of channels and a second end with a chamber and the plurality of channels extend to the chamber, wherein the first end of the second member is operably configured to engage a second type of electrical receptacle, and the second end of the second member is disposed adjacent to the first end of the first member; and,
    a third member comprising a first connector, a second connector, a plurality of electrical contacts, and a printed circuit board (PCB) having a first and second surface, wherein the first connector extends from the first surface in a first direction;
    wherein the first and second connector are attached to the first surface of the PCB and the PCB is disposed between the first member and second member such that the first connector is disposed in the hollow body of the second end of the first member and the second connector is engaged with the electrical ground of the first member;
    wherein the plurality of electrical contacts are fixedly attached to the second surface of the PCB and a plurality of the plurality of electrical contacts are in electrical communication with the first connector, and the remaining contacts of the plurality of electrical contacts are in electrical communication with the second connector, and wherein the plurality of contacts extend from the second surface in a second direction opposing the first direction; and,
    wherein the plurality of electrical contacts are disposed in the plurality of channels of the second member.

2. The continuity tester adaptor, as recited in claim 1, wherein the second end of the first member is a male F-type series connector and the first connector of the third member is a male pin in the male F-type series connector and the combination of the second end and the first connector arc operably configured to engage a female F-type series receptacle.

3. The continuity tester adaptor, as recited in claim 2, wherein the plurality of electrical connectors in the third member have an equal number of positive and negative contacts, and the PCB is operably configured to electrically connect the positive contacts to the first connector and the negative contacts to the second connector.

4. The continuity tester adaptor, as recited in claim 1, wherein the second end of the second member is a male RJ-series type connector and is operably configured to engage a female RJ-series receptacle.

5. The continuity tester adaptor, as recited in claim 1, further comprising a light emitting diode (LED) disposed on the PCB, and wherein the PCB includes dial tone circuitry electrically connected to the LED and wherein the dial tone circuitry is operably configured to detect at least one of an on-hook and an off-hook voltage in a telephone line when the tester adaptor is in use with testing a phone line.

6. The continuity tester adaptor, as recited in claim 5, wherein the LED has a first color for the on-hook voltage and a second color for the off-hook voltage.

7. The continuity tester adaptor, as recited in claim 1, wherein the first member is constructed out of a non-conductive material and further comprising a conductive insert in the second end.

8. The continuity tester adaptor, as recited in claim 1, wherein the second member is constructed out of a transparent non-conductive material.

9. The continuity tester adaptor, as recited in claim 1, wherein the first end of the first member further includes a cavity and the PCB and the second end of the second member are disposed in the cavity.

10. The continuity tester adaptor, as recited in claim 1, wherein the first member and the second member each have an axis, which are substantially parallel and the first and second surfaces of the PCB are substantially perpendicular to the axes.

11. A printed circuit board for an electrical continuity tester adaptor comprising:
    a first surface and second surface;
    a first connector disposed on the first surface, and operably configured to engage a positive contact on a first type of electrical receptacle, wherein the first connector extends from the first surface in a first direction;
    a second connector disposed on the first surface and operably configured to engage a ground contact on the first type of electrical receptacle;
    a plurality of contacts having a plurality of positive and negative contacts being disposed on the second surface and operably configured to engage a second type of electrical receptacle, wherein the plurality of contacts extend from the second surface in a second direction opposing the first direction;
    a first conducting path operably configured to complete an electrical connectivity between the first connector and the plurality of positive contacts; and,
    a second conducting path operably configured to complete an electrical connectivity between the second connector and the plurality of negative contacts.

12. The printed circuit board for an electrical continuity tester adaptor, as recited in claim 11, wherein the first connector is a male pin for an F-type connector and the second connector engages a ground on the F-type connector.

13. The printed circuit board for an electrical continuity tester adaptor, as recited in claim 11, further comprising a light emitting diode (LED) disposed on the printed circuit board and a dial tone circuitry electrically connected to the LED, wherein the dial tone circuitry is operably configured to detect at least one of an on-hook and an off-hook voltage in a telephone line when the tester adaptor is in use with testing a phone line.

14. The printed circuit board for an electrical continuity tester adaptor, as recited in claim 13, wherein the LED has a first color for the on-hook voltage and a second color for the off-hook voltage.

* * * * *